United States Patent
Liu et al.

(10) Patent No.: US 10,432,432 B1
(45) Date of Patent: Oct. 1, 2019

(54) LOSS OF SIGNAL DETECTOR WITH PVT COMPENSATION

(71) Applicant: NXP B.V., Eindhoven (NL)

(72) Inventors: Xiaoqun Liu, Chandler, AZ (US); Siamak Delshadpour, Phoenix, AZ (US); Ahmad Yazdi, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/047,824

(22) Filed: Jul. 27, 2018

(51) Int. Cl.
H04L 25/03 (2006.01)
H04B 3/46 (2015.01)
H03K 5/24 (2006.01)

(52) U.S. Cl.
CPC ......... H04L 25/03057 (2013.01); H03K 5/24 (2013.01); H04B 3/46 (2013.01); *H04L 2025/03783* (2013.01)

(58) Field of Classification Search
CPC .......... H04B 2201/709709; H04B 3/46; H04L 25/03025; H04L 25/03057; H04L 25/03885; H04L 25/03031; H04L 25/03006; H04L 25/03019; H03K 5/24
See application file for complete search history.

(56) References Cited

U.S. PATENT DOCUMENTS

| | | | | |
|---|---|---|---|---|
| 6,381,270 B1* | 4/2002 | Lydon | ............... | H04L 25/03885 333/28 R |
| 6,819,166 B1* | 11/2004 | Choi | ................. | H04L 25/03885 327/551 |
| 2012/0092049 A1* | 4/2012 | Hasegawa | ................ | H04B 3/04 327/156 |

OTHER PUBLICATIONS

S. Kawar, et al; "A 10 Gbps Loss of Signal Detector for High-Speed AC-Coupled Serial Transceivers in 28nm CMOS Technology"; IEEE International Conference pp. 1-4. (2014).
R. Walker, et al. "A 2.488 Gb/s Si-bipolar clock and data recovery IC with robust loss of signal detection," IEEE International Solids-State Circuits Conference.(1997).

* cited by examiner

*Primary Examiner* — Khanh C Tran

(57) ABSTRACT

An electronic circuit, including an equalizer circuit to input a differential signal, a rectifier circuit to receive the differential signal and output a first current and a second current, a replica circuit to receive a differential threshold signal and output a third current and a fourth current to compensate for PVT variations in the first and second currents, and a comparator circuit configured to compare a differential voltage generated based on the first, second, third, and fourth currents to determine a loss of signal event of the electronic circuit.

12 Claims, 2 Drawing Sheets

LOSS OF SIGNAL DETECTOR WITH PVT COMPENSATION

TECHNICAL FIELD

Embodiments disclosed herein relate generally to loss of signal detection in high speed circuits.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include an electronic circuit including an equalizer circuit to input a differential signal and output a differential equalized signal, a rectifier circuit to receive the differential equalized signal and output a first current and a second current, a replica circuit to receive a differential threshold signal and output a third current and a fourth current to compensate for PVT variations in the first and second currents, and a comparator circuit configured to compare a differential voltage generated based on the first, second, third, and fourth currents to determine a loss of signal event of the electronic circuit.

The first current from the rectifier circuit may be added to the third current from the replica circuit and flows through first output resistor to determine a signal to be input to a non-inverting input of the comparator.

The second current from the rectifier circuit may be added to the fourth current from the replica circuit and flows through a second output resistor to determine a signal to be input to an inverting input of the comparator.

The differential equalized signal may include a first equalized voltage, a second equalized voltage, and an equalized common voltage The first equalized voltage may control a first transistor of the rectifier circuit and the second equalized voltage controls a second transistor of the rectifier circuit. The equalized common voltage jointly may control a third transistor and a fourth transistor of the rectifier circuit.

The electronic circuit may be manufactured on a chip having a bandgap voltage, and wherein a threshold of the output of the electronic circuit is based on a multiple of the bandgap voltage.

Embodiments also include a method of operating an electronic circuit, including inputting a differential signal and outputting a first equalized voltage, a second equalized voltage, and an equalized common voltage, using the first equalized voltage, the second equalized voltage, and the equalized common voltage in a rectifier circuit to produce a first current and a second current each having a PVT variation, inputting a threshold signal to a replica circuit to produce a third current and a fourth current to cancel the PVT variations of the first current and second current; determining a first voltage based on the first current and third current; determining a second voltage based on the third current and fourth current; and comparing the first voltage and the second voltage to determine a loss of signal event in the electronic circuit.

The first equalized voltage may control a first transistor of the rectifier circuit, the second equalized voltage controls a second transistor of the rectifier circuit, and the equalized common voltage may control third and fourth transistors of the rectifier circuit.

The threshold signal may include a differential signal and a common reference signal. The differential signal may control first and second transistors of the replica circuit and the common reference signal controls third and fourth signals of the rectifier circuit.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
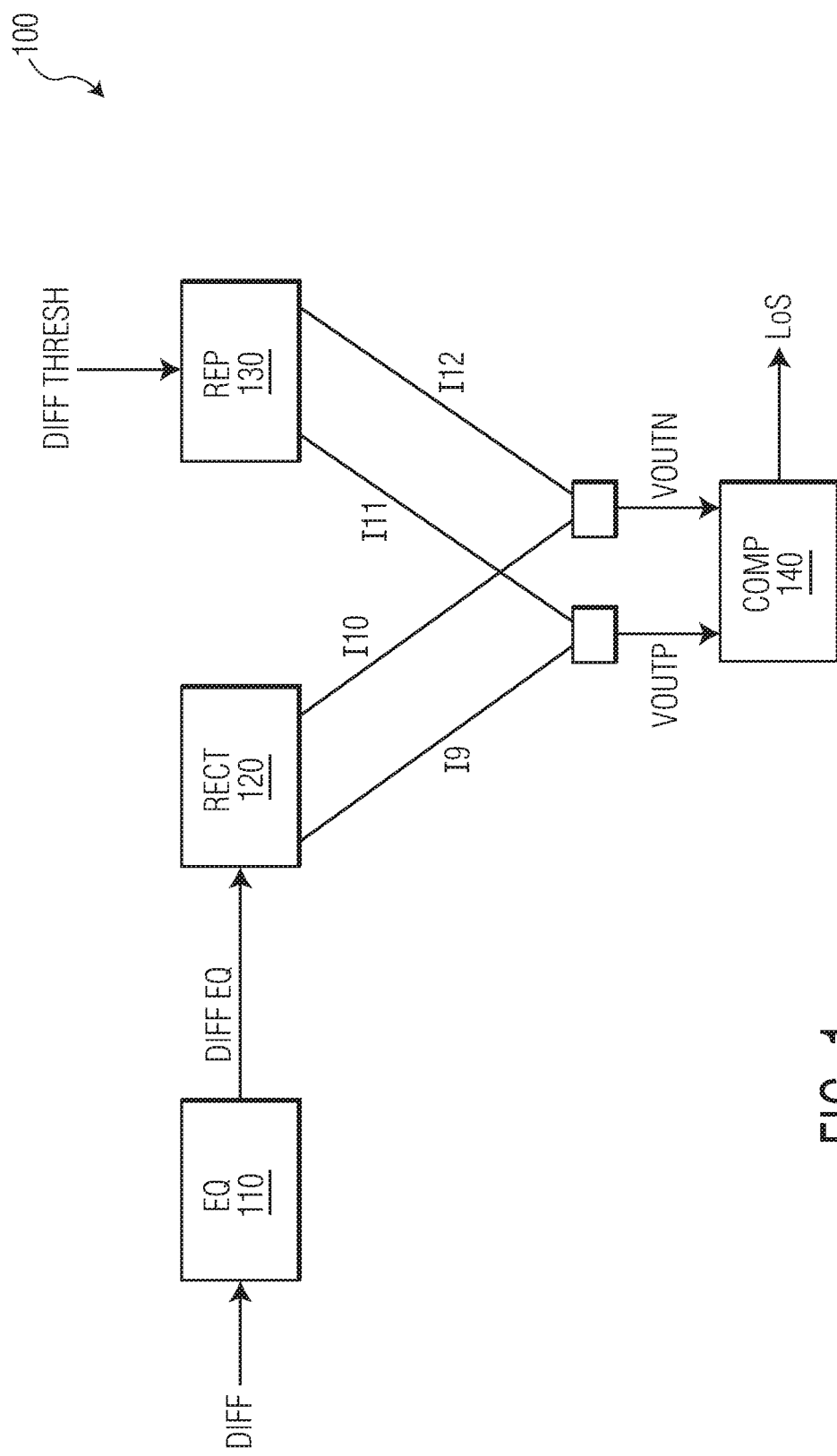
FIG. 1 illustrates a loss of signal detector in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In USB (universal serial bus) or DP (display port) highspeed re-driver systems, a loss of signal (LoS) detector is positioned at an input of a highspeed re-driver to detect the presence of a highspeed signal. When an input signal level is lower than the LoS detector threshold, for example, 40 mV differential peak to peak, a LoS detector triggers a loss of signal event and a system disables the highspeed re-driver to save power consumption or avoid amplifying noise or a destroyed signal. Conventional designs of LoS detectors suffer from very low accuracy and become the bottle neck of designs of highspeed re-driver systems when highspeed signals are attenuated by a long universal serial bus (USB) or display port (DP) cable. According to embodiments described herein, a LoS detector threshold accuracy is improved by using a replica circuit of a rectifier to compensate for the variation of the rectifier across process, supply voltage, and temperature (PVT).

In USB and DP highspeed re-driver systems, after attenuation of a long USB or DP cable, or long PCB trace line, differential peak to peak levels of a highspeed signal can be attenuated to a few tens of mV, or even lower. To detect such a low voltage signal, a high accuracy LoS detector may be used.

Also in conventional designs of LoS detectors, the spread of a detection threshold can be as large as 100 mV, or even larger, across PVT. In order for a highspeed signal to be effectively detected, highspeed re-driver circuits with conventional designs of LoS detectors have required highspeed signals at the input of the highspeed re-driver to be higher than 100 mV or even 200 mV. This high threshold has limited the length of the USB or DP cable, or PCB trace. According to embodiments described herein, across PVT, a smaller spread is designed for, to allow a lower signal level at the input of the redriver to be detected.

Embodiments described herein improve the accuracy of the LoS detector and therefore the required highspeed signal level at the input of the highspeed re-driver is reduced such that longer USB/DP cables and/or PCB traces for highspeed signal transmission may be used.

Figure 2:
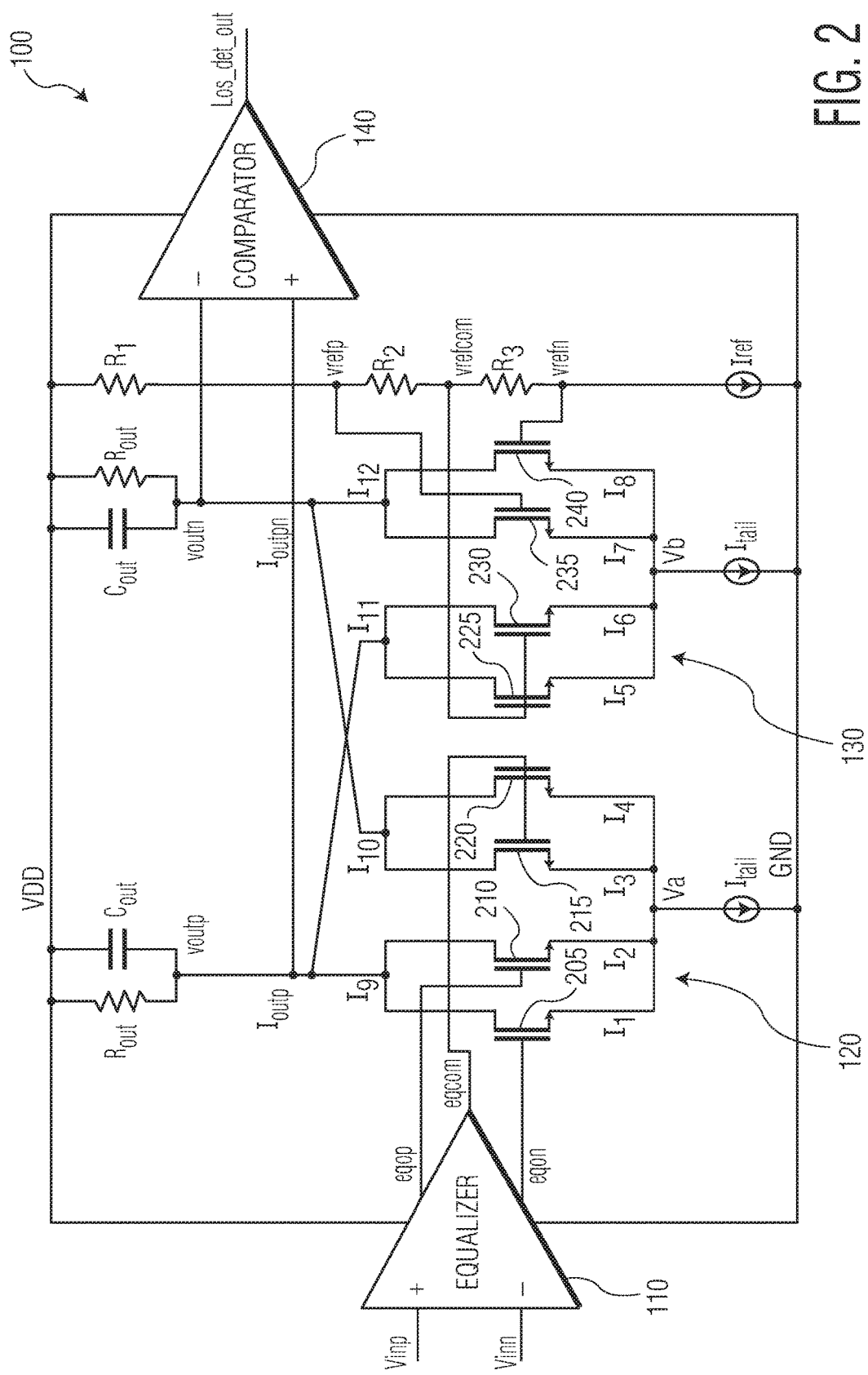
FIG. 2 illustrates a topology of the loss of signal detector in accordance with FIG. 1.

As illustrated in FIGS. 1 and 2, a LoS detector circuit 100 may include an equalizer 110, a rectifier circuit 120, a reference level generator circuit 130 that acts as a replica circuit of the rectifier circuit 120, and a comparator 140.

Differential inputs $V_{INP}$ and $V_{INN}$ are normally driven to opposite states by a differential transmitter (not illustrated). Differential inputs $V_{INP}$ and $V_{INN}$ are input to the equalizer 110. The equalizer 110 can restore high-frequency components relative to low-frequency components of the input signal on $V_{INP}$ and $V_{INN}$. One or more control signals may control operation of the equalizer 110 so that the degree of equalization and attenuation of different frequency components can be controlled, such as by external pins or by a programmable register.

The equalizer 110 outputs diffential equalized signals eqop and eqon to control the transistors 210 and 205 of the recitifier circuit 120. Currents I1 and I2 represent the current flowing in transistors 205 and 210, respectively, when the transistors are ON. In the rectifier circuit 120 regardless of whether the value of eqop or eqon is greater, the sum of the currents I1+I2 through transistors 205 and 210 will equal I9. Current I9 through the resistor Rout is partially used to form Ioutp and set a voltage level at the non-inverting input of the comparator 140, in order to determine a LoS event. The parallel RC circuit of Rout and Cout may be used to filter ripple voltage from the rectificer circuit 120 and reference level generator circuit 130. The Rout Cout circuit may filter ripple voltage and send DC voltages voutp and voutn to the comparator 140.

Transistors 205 and 210 of the rectifier circuit 120 capture the delta voltage between eqop and eqon. The common mode voltage eqcom of eqop and eqon is sent to transistors 215 and 220. Currents I3 and I4 sum to I10, which is partially used to form Ioutn and set the voltage level at the inverting input of the comparator 140.

The reference level generator circuit 130 is a replica of the rectifier circuit 120. Currents I11 and I12 may be produced from transistors 225, 230, 235, and 240 in a similar manner as currents I9 and I10. A predetermined threshold voltage of the LoS detector circuit 100 may be set at nodes vrefp and vrefn, using resistors R1, R2, and R3. Vrefp minus vrefn is set to be the desired threshold voltage. Vrefp and vrefn are used to control transistors 235 and 240. The common mode reference signal vrefcom is used to control transistors 225 and 230. Currents I5 and I6 are summed to create current I11 that is added to current I9 to produce Ioutp. Currents I7 and I8 are summed to create current I12 that is added to current I10 to create output current Ioutn. As illustrated in FIG. 1, where transistors 205, 210, 215, 220, 225, 230, 235, and 240 all have substantially the same channel width=W and channel length=L, a highspeed signal is buffered and equalized by the equalizer 110. Voltage at the bottom node may be set to Va. Currents I1, I2, I3, I4 can be calculated using the following equations:

$$I_1 = (1/2)*\mu_n*C_{ox}*(W/L)[(V_{cm}-(1/2)*\text{delta}(V)-V_a)-V_{thn}]^2 \quad (1)$$

$$I_2 = (1/2)*\mu_n*C_{ox}*(W/L)[(V_{cm}+(1/2)*\text{delta}(V)-V_a)-V_{thn}]^2 \quad (2)$$

$$I_3 = (1/2)*\mu_n*C_{ox}*(W/L)[(V_{cm}-V_a)-V_{thn}]^2 \quad (3)$$

$$I_4 = (1/2)*\mu_n*C_{ox}*(W/L)[(V_{cm}-V_a)-V_{thn}]^2 \quad (4)$$

Where $\mu_n$ is the mobility of the transistor, and $C_{ox}$ is the gate oxide capacitance per unit area of the transistor. Delta (V) is voltage difference between eqop and eqon. Vcm is the voltage of eqcom. $V_a$ is a bias voltage for the rectifier circuit 120 and Vb is a bias voltage for the reference level generator 130 circuit. Current sources $I_{TAIL}$ provide bias current for the transistors.

The current difference between $I_9$ and $I_{10}$ can be calculated as the follows:

$$I_9 - I_{10} = (I_1+I_2)-(I_3+I_4) = (1/4)*\mu_n*C_{ox}*(W/L)[\text{delta}(V)]^2 \quad (5)$$

Therefore, similar as the previous calculation, the delta current between $I_{11}$ and $I_{12}$ can be calculated as the follows:

$$I_{12}-I_{11} = (1/4)*\mu_n C_{ox}*(W/L)[\text{delta}(V_{ref})]^2 \quad (6)$$

$$\text{delta}(V_{ref}) = V_{refp}-V_{refn} = I_{ref}*(R_2+R_3) = I_{ref}*R_{ref} \quad (7)$$

Where $R_2=R_3=R_{ref}/2$. $I_{ref}$ is generated from the chip main bias by using bandgap voltage, $V_{bg}$, divided by a resistor, R, that is, $$I_{ref} = V_{bg}/R \quad (8)$$

$$I_{12}-I_{11} = (1/4)*\mu_n*C_{ox}*(W/L)[V_{bg}*(R_{ref}/R)]^2 \quad (9)$$

Knowing I9, I10, I11, and I12, Voutp and Voutn can be determined by multiplying respective currents Ioutp and Ioutn by Rout. If Voutp>Voutn, the output of the comparator 140 will be High. If Voutp<Voutn, the output of the comparator 140 will be Low. With Voutp and Voutn, equation 10 ensures that the trip point of the comparator 140 becomes:

$$V_{outp}-V_{outn} = [V_{dd}-(I_9+I_{11})*R_{out}]-[V_{dd}-(I_{10}+I_{12})*R_{out}]$$
$$= [(I_{12}-I_{11})-(I_9 I_{10})]*R_{out} = 0 \quad (10)$$

Plugging equations (5) and (9) into equation (10), equation 11 results:

$$V_{outp}-V_{outn} = (1/4)*\mu_n*C_{ox}*(W/L)*\{[V_{bg}*(R_{ref}/R)]^2 - [\text{delta}(V)]^2\}*R_{out} = 0 \quad (11)$$

Vbg is the bandgap voltage of the main chip bias. When delta(V) is higher than $V_{bg}*(R_{ref}/R)$, $V_{outn}$ is higher than $V_{outp}$, and the comparator output is low to note that a highspeed signal is detected. When delta(V) is lower than $V_{bg}*(R_{ref}/R)$, $V_{outn}$ is lower than $V_{outp}$, and the comparator output is high to note that a highspeed signal is not detected, and there is loss of signal. According to embodiments described herein, the LoS threshold determined by the comparator 140 is determined by $V_{bg}*(R_{ref}/R)$, where $V_{bg}$ is an accurate bandgap voltage and $R_{ref}/R$ is a constant number defined by the design.

According to embodiments, accuracy may be finely calibrated to plus or minus 10 mV. If a LoS threshold is set to 40 mV, the threshold may be between 30 mV and 50 mV. This may allow the signal level to be much lower at the input of the redriver.

Because the rectifier circuit 120 and the reference level generator circuit 130 are manufactured using the same processes, PVT variations can be accounted for and cancel each other out. Because of PVT compensation, the variation of I11 compensates for the variation of I10. The variation of I12 compensates for the variation of I9. The PVT variations of the rectifier circuit 120 may be canceled by the PVT variations of the reference level generator circuit 130 to obtain a more accurate measurement. There is a relationship between the two circuits, based on the equations of the circuits working together.

Designed on the same chips, the rectifier circuit 120 and the replica reference level generator circuit 130 experience the same PVT conditions, and they cancel each other, such that the PVT variations are negated.

Not having to account for PVT variations, the LoS detector circuit 100 has a higher accuracy and may be set to a lower threshold level, and therefore use longer cables. A LoS detector of embodiments described herein that is placed at an end of a long cable will be better able to detect a true LoS signal, or detect a real signal that has attenuated over a long distance.

The LoS detector circuit 100 may be designed using CMOS processes. Transistors may be designed to use an NMOS configuration. The LoS detector circuit 100 may also be designed using BiCMOS processes, where the transistors are structured as high speed NPN bipolar junction transistors.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. An electronic circuit, comprising:
an equalizer circuit to input a differential signal and output a differential equalized signal;
a rectifier circuit to receive the differential equalized signal and output a first current and a second current;
a replica circuit to receive a differential threshold signal and output a third current and a fourth current to compensate for process, supply voltage, or temperature (PVT) variations in the first and second currents; and
a comparator circuit configured to compare a differential voltage generated based on the first, second, third, and fourth currents to determine a loss of signal event of the electronic circuit;
wherein the differential equalized signal includes a first equalized voltage, a second equalized voltage, and an equalized common voltage.

2. The electronic circuit of claim 1, wherein the first current from the rectifier circuit
is added to the third current from the replica circuit and flows through a first output resistor to determine a signal to be input to a non-inverting input of the comparator.

3. The electronic circuit of claim 1, wherein the second current from the rectifier circuit
is added to the fourth current from the replica circuit and flows through a second output resistor to determine a signal to be input to an inverting input of the comparator.

4. The electronic circuit of claim 1, wherein
the first equalized voltage controls a first transistor of the rectifier circuit and
the second equalized voltage controls a second transistor of the rectifier circuit.

5. The electronic circuit of claim 1,
wherein the equalized common voltage jointly controls a third transistor and a fourth transistor of the rectifier circuit.

6. The electronic circuit of claim 1,
wherein the electronic circuit is manufactured on a chip having a bandgap voltage, and
wherein a threshold of the output of the electronic circuit is based on a multiple of the bandgap voltage.

7. The electronic circuit of claim 1, wherein the differential threshold signal received by the replica circuit is adjusted by a resistive voltage divider circuit.

8. A method of operating an electronic circuit, comprising:
inputting a differential signal and outputting a first equalized voltage, a second equalized voltage, and an equalized common voltage;
using the first equalized voltage, the second equalized voltage, and the equalized common voltage in a rectifier circuit to produce a first current and a second current each having a process, supply voltage, or temperature (PVT) variation;
inputting a threshold signal to a replica circuit to produce a third current and a fourth current to cancel the PVT variations of the first current and second current;
determining a first voltage based on the first current and third current;
determining a second voltage based on the third current and fourth current; and
comparing the first voltage and the second voltage to determine a loss of signal event in the electronic circuit.

9. The method of claim 8, wherein
the first equalized voltage controls a first transistor of the rectifier circuit,
the second equalized voltage controls a second transistor of the rectifier circuit, and
the equalized common voltage controls third and fourth transistors of the rectifier circuit.

10. The method of claim 8,
wherein the threshold signal includes a differential signal and a common reference signal.

11. The method of claim 10,
wherein the differential signal controls first and second transistors of the replica circuit and the common reference signal controls third and fourth signals of the rectifier circuit.

12. An electronic circuit, comprising:
an equalizer circuit to input a differential signal and output a differential equalized signal;
a rectifier circuit to receive the differential equalized signal and output a first current and a second current;
a replica circuit to receive a differential threshold signal and output a third current and a fourth current to compensate for process, supply voltage, or temperature (PVT) variations in the first and second currents; and a comparator circuit configured to compare a differential voltage generated based on the first, second, third, and fourth currents to determine a loss of signal event of the electronic circuit;
wherein the electronic circuit is manufactured on a chip having a bandgap voltage, and
wherein a threshold of the output of the electronic circuit is based on a multiple of the bandgap voltage.

* * * * *